(12) United States Patent
Hwang et al.

(10) Patent No.: US 7,717,628 B2
(45) Date of Patent: May 18, 2010

(54) SYSTEM PACKAGE USING FLEXIBLE OPTICAL AND ELECTRICAL WIRING AND SIGNAL PROCESSING METHOD THEREOF

(75) Inventors: Sung Hwan Hwang, Gwangju (KR); Byung Sup Rho, Gwangju (KR); Jung Woon Lim, Gwangju (KR); Woo Jin Lee, Gwangju (KR)

(73) Assignee: Korea Photonics Technology Institute, Gwangju (KR)

( * ) Notice: Subject to any disclaimer, the term of this patent is extended or adjusted under 35 U.S.C. 154(b) by 0 days.

(21) Appl. No.: 12/350,978

(22) Filed: Jan. 9, 2009

(65) Prior Publication Data

US 2009/0180733 A1    Jul. 16, 2009

(30) Foreign Application Priority Data

Jan. 14, 2008    (KR)  ............... 10-2008-0003925

(51) Int. Cl.
G02B 6/36 (2006.01)
G02B 6/26 (2006.01)
G02B 6/42 (2006.01)

(52) U.S. Cl. .............. 385/88; 385/14; 385/15; 385/31; 385/39; 385/47; 385/49; 385/89; 385/92; 385/94

(58) Field of Classification Search ............ 385/88, 385/89, 92, 94
See application file for complete search history.

(56) References Cited

U.S. PATENT DOCUMENTS

| 5,757,998 | A  | * | 5/1998 | Thatcher et al. | 385/75 |
|---|---|---|---|---|---|
| 6,611,635 | B1 | * | 8/2003 | Yoshimura et al. | 385/14 |
| 7,333,682 | B2 | * | 2/2008 | Kobayashi et al. | 385/14 |
| 7,509,001 | B2 | * | 3/2009 | Hirano et al. | 385/14 |
| 2004/0218848 | A1 | * | 11/2004 | Shen et al. | 385/14 |
| 2007/0019914 | A1 | * | 1/2007 | Ohtsu et al. | 385/89 |
| 2008/0075405 | A1 | * | 3/2008 | Wang et al. | 385/14 |

* cited by examiner

Primary Examiner—Ryan Lepisto
(74) Attorney, Agent, or Firm—Bardmesser Law Group (57) ABSTRACT

A system package using flexible optical waveguides and electrical wires, and a signal processing method thereof are disclosed. Several rigid substrates having highly integrated electronic elements and optical elements mounted thereon can be electrically and optically connected by using flexible substrates that are electrically wired and optically connected. The package can be variously changed when configuring the package by the flexible substrate and the heat dissipation device and the electromagnetic shielding device are installed in the inside of the package, making it possible to solve electromagnetic wave interference problems and thermal problems occurring in the inside of the package.

7 Claims, 7 Drawing Sheets

SYSTEM PACKAGE USING FLEXIBLE OPTICAL AND ELECTRICAL WIRING AND SIGNAL PROCESSING METHOD THEREOF

CROSS-REFERENCE TO RELATED APPLICATIONS

This application claims priority to Korean Patent Application No. 10-2008-0003925, filed on Jan. 14, 2008, the entire contents of which is hereby incorporated by reference.

BACKGROUND OF THE INVENTION

1. Field of the Invention

The present invention relates to a system package that uses flexible optical and electrical wiring, which connects two rigid substrates having at least one integrated circuit mounted thereon by using a flexible substrate with opto-electric wiring (optical waveguides and electrical wiring) and a signal processing method thereof.

2. Description of the Related Art

A system package technology utilizes a technology that forms a package with a multi-chip module formed of several chips, including highly integrated circuits, such as microprocessors in one package.

Figure 1:
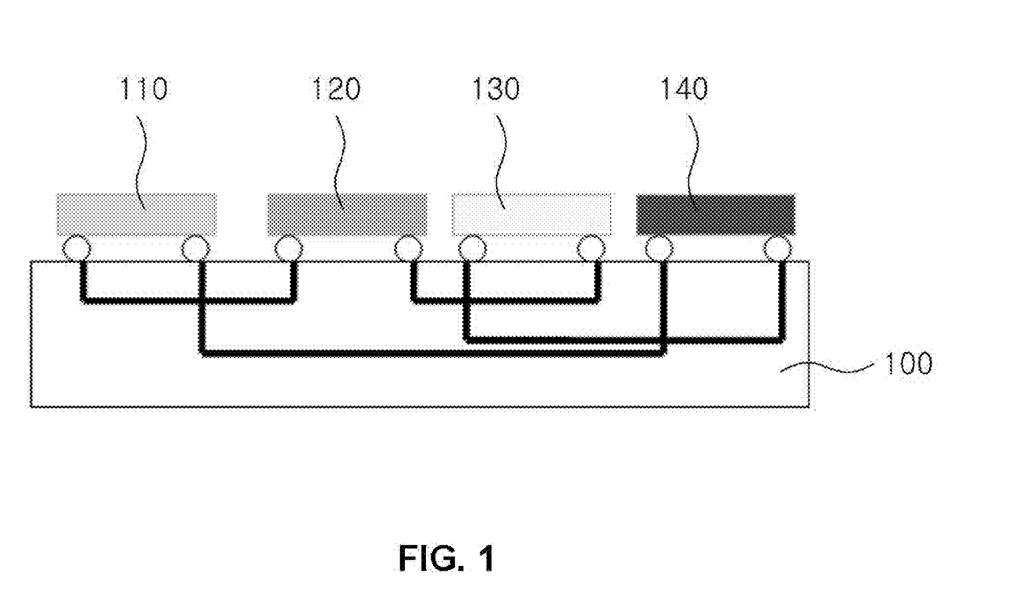
FIG. 1 is a cross-sectional view showing a system package of the prior art.

Conventional system package technology electrically connects a radio-frequency integrated circuit (RF IC) 110, a digital integrated circuit (Digital IC) 120, an analog integrated circuit (Analog IC) 130, and an optical integrated circuit (Optical IC) 140, and the like and then mounts them on a substrate 100 for a single rigid package (see FIG. 1).

The system package is formed by mounting various integrated circuits on one substrate at high density, making it possible to reduce a size of the entire package, as well as perform various electrical functions.

However, as various devices become more highly integrated, electromagnetic interference and thermal problems occur between the devices, such that errors in processing and transmitting data become possible. As a result, there occurs a disadvantage in that the devices do not fully function as the system package.

Therefore, there is a need for a package system that can solve the electromagnetic interference and thermal problems while performing various electrical functions.

SUMMARY OF THE INVENTION

In order to solve the above described problems in the related art, a system package using opto-electric wiring is provided, which can transmit electrical signals as well as optical signals by connecting a plurality of rigid substrates having a plurality of chips integrated thereon, and by using a flexible substrate that is optically and electrically wired and can be changed into various structures. Also, a signal processing method of the system package is provided.

In order to solve the above described problems in the related art, a system package using flexible opto-electric connections is provided, which can solve thermal problems by providing spacing between rigid substrates using a flexible substrate and can minimize electromagnetic wave interference that occurs when connecting high-speed data signals, by using the optical waveguides in the flexible substrate to effectively transmit data.

In order to achieve the above objects, a system package using flexible opto-electric wiring comprises a flexible substrate that can electrically and optically connect several rigid substrates having highly integrated electronic and opto-electric elements mounted thereon, and which can be easily bent, and which transmits signals without electromagnetic wave interference. Also, a signal processing method of the system package is disclosed.

There is provided a system package using flexible opto-electric wiring including a plurality of rigid substrates having integrated circuit elements mounted thereon; a plurality of flexible substrates connected to the rigid substrates; and optical and electrical wires that are included in the rigid substrates and the flexible substrates to connect them to each other. The rigid substrates can be vertically stacked.

The integrated circuit element includes an optical integrated circuit with a light source and a photo detector, a digital integrated circuit, an analog integrated circuit, and a high frequency integrated circuit. The system package further includes a heat dissipation device and/or an electromagnetic wave shielding device between the rigid substrates.

A system package comprises at least one flexible substrate having an integrated circuit element mounted thereon and connected by optical and electrical wires.

A signal processing method of a system package using flexible opto-electric wirings includes steps of applying data signals input by an external system to a first integrated circuit through electrical wires of a first rigid substrate, processing the signals by a processor of the first integrated circuit, and then converting the signals from electrical to optical form; transmitting the converted optical signals to a second rigid substrate via a flexible substrate; and converting the transmitted optical signals to electrical form through a second integrated circuit, processing the converted signals by the processor of the second integrated circuit, and then transmitting them to an external system.

At the step of transmitting the processed signals to the external system, the external system comprises the flexible substrate, the external system board, and the rigid substrate.

Since the system package is formed by connecting the plurality of rigid substrates using the flexible substrate that can be easily bent, it can be changed into various structures and easily installed without any structural limitation.

Also, as the rigid substrates are electrically and optically connected by including opto-electric wiring (optical waveguides and electrical wiring) inside the flexible substrate, high-speed signal transmission can be achieved. Also, as the rigid substrates are formed by being spaced by a predetermined distance from each other, thermal problems caused by the integrated circuits is solved, which prevents the malfunction of the electronic processes.

Further, as the signals are transmitted through the opto-electric wiring inside of the flexible substrate, the electromagnetic wave interference problem caused due to the signal speed and the wire length is solved, such that errors in transmitting signals are prevented.

In addition, as the multi-process chip, which can be operated at high-speed and has high reliability, is manufactured by mounting the plurality of processor chips (integrated circuits) in one integrated circuit system package, it can be variously applied to high-speed, high-reliability next generation electronic systems such as a next-generation computer.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the embodiments of the present invention, examples of which are illustrated in the accompanying drawings.

A system package can be used by integrating a system on package (SOP), a system in package (SIP), and a multi-chip module (MCM).

Hereinafter, the various embodiments of the present invention will be described in detail with reference to the accompanying drawings. When inserting reference numerals into the constituents in the respective drawings, although the constituents are illustrated in different drawings, so far as the constituents are the same, they are described to have the same reference numeral, where possible. The detailed description for the well-known function and constitution, judged to make the gist of the invention obscure, will be omitted.

Figure 2:
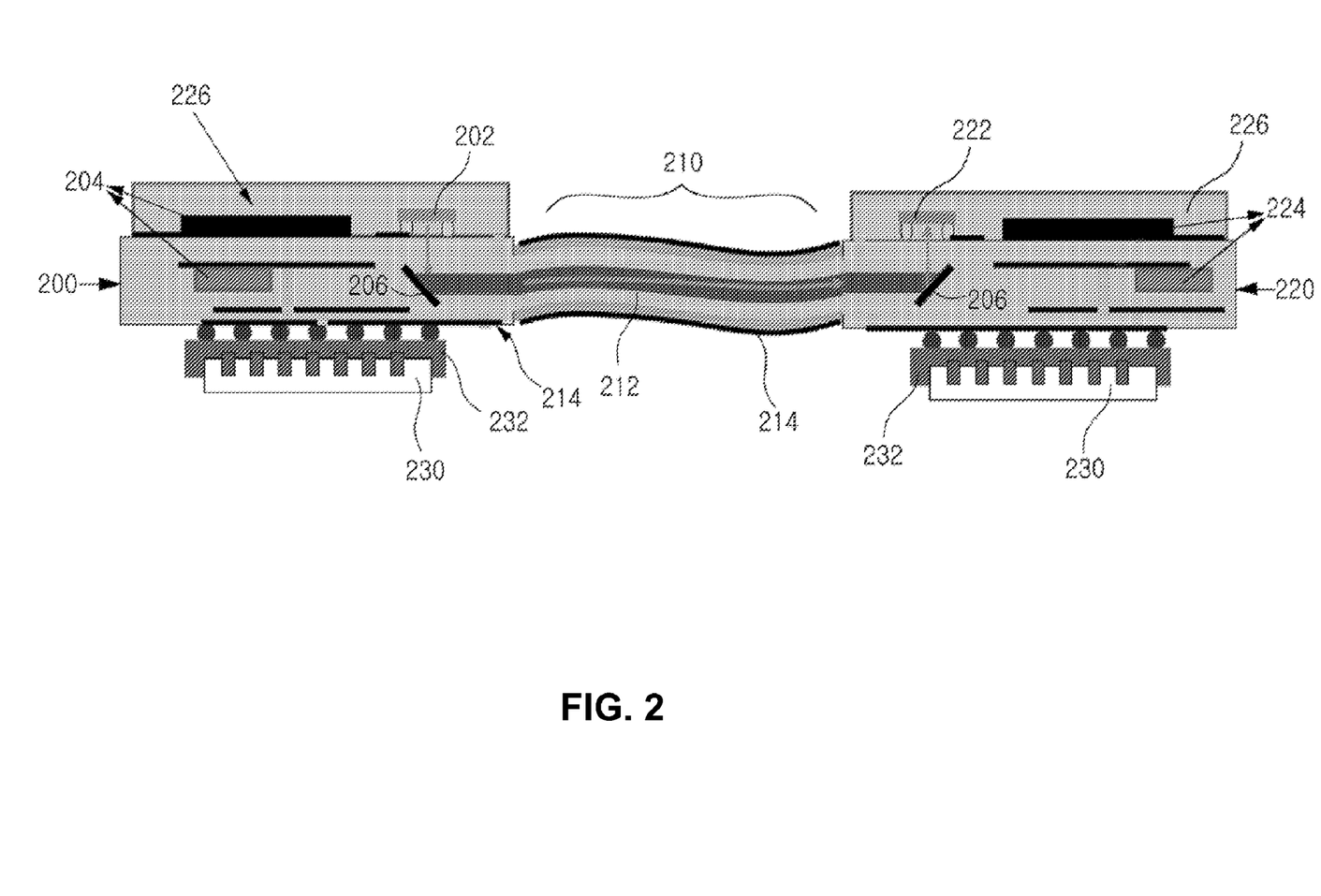
FIG. 2 is a cross-sectional view showing a system package using flexible opto-electric wiring according to one embodiment of the present invention.

FIG. 2 is a cross-sectional view showing a system package using flexible opto-electric wiring according to one embodiment of the present invention. The system package includes a first rigid substrate 200, a flexible substrate 210, and a second rigid substrate 220. The rigid substrate can be made of thermosetting resin, ceramic, teflon and similar materials, for example, it can be made of thermosetting epoxy resin (FR-4) called by 'prepreg'. The flexible substrate can be made of polyimide or similar materials. A point of reference between the rigidity and flexibility of the substrates is the possibility of substrate warpage. That is, the rigid substrate is not bent three-dimensionally after being hardened, except to a very minor extent. On the other hand, the flexible substrate is the sheet of film-type materials and is characteristic of three-dimensionally bent and curved substrate.

The flexible substrate, according to the invention, can be manufactured by the following process. First, optical waveguide sheets, comprised of the metal thin-film mirror tilted to the left or right, are laminated in the flexible substrate and electrically wired. Then the flexible substrate is inserted into the middle of the rigid substrate. The mechanical alignment or connection between the flexible substrate and the rigid substrate is made by using guide pins and holes (not shown in FIG. 2). On the other hand, the electrical connection between the flexible substrate and the rigid substrate is performed by via holes (not shown in FIG. 2).

The first rigid substrate 200 and the second rigid substrate 220 include a light source 202, a photo detector 222, a first integrated circuit 204, a second integrated circuit 224, a mirror 206, and a package cover 226. The flexible substrate 210 includes an optical waveguide 212 and an electrical wire 214.

Referring to FIG. 2, the first rigid substrate 200 and the second rigid substrate 220 are connected by using the flexible substrate 210 that can be easily bent, thereby forming the system package. Although not shown in the drawing, the integrated circuit is formed on the flexible substrate, and the integrated circuit system package can be configured of only the flexible substrate. Further, one system package can be formed in a desired structure by using the plurality of rigid substrates 200/220 and the plurality of flexible substrates 210.

The first rigid substrate 200 includes a light source 202 that is an optical integrated element and comprises a first integrated circuit 204 that is configured of a digital integrated circuit, an analog integrated circuit, and a high frequency integrated circuit.

The first integrated circuits 204 are mounted on the inside and outside of the first rigid substrate 200 and can be electrically connected through a system board 230 and an electric socket 232 that exist on the outside.

The data signals input by the external system board 230 are applied to the first integrated circuits 204 through an internal electrical wire 214 in the first rigid substrate 200 and the data signals received in the first integrated circuit 204 are processed using the processor in the inside of the integrated circuit, electric-optic converted, and then transmitted to the optical waveguide 212 of the flexible substrate 210 via the light source 202.

The flexible substrate 210 comprises the electrical wire 214 and the optical waveguide 212 and the electrical wire 214 can be used for low-speed data transmission, a control signal line, a power supply line, and a ground line, and the like. The optical waveguide 212 can be used for high-speed data transmission, clock and control signal lines, and the like.

Thereby, the optical signal transmitted at high-speed through the optical waveguide 212 has no signal interference between the signal lines, unlike the high-speed electrical signals, making it possible to make the transmission length long.

The second rigid substrate 220 receives the optical signals transmitted by the first rigid substrate 100 via the flexible substrate 210 through the photo detector 222 and the received signals are opto-electric-converted using the second integrated circuit 224, processed according to the processor inside of the integrated circuit, and transmitted to the external system board 230.

At this time, in order to transmit the optical signals passing through the light source 202 and the photo detector 222 of the first and second rigid substrates 200 and 220 to the optical waveguide 212 of the flexible substrate 210, a mirror 206 is installed inside of the first and second rigid substrates 200 and 220 at a predetermined angle (for example, 45°), thereby transmitting and receiving the signals without loss.

The first and second integrated circuits 204 and 224 may be formed with various electronic elements such as capacitors, inductors, and resistors, and the like and the first and second integrated circuits 204 and 224 use a package cover 226 such that they can be protected from foreign materials such as dust.

The package is formed in an order of the rigid substrate-flexible substrate-rigid substrate, but it is not particularly limited thereto. Therefore, the package may be formed of the rigid substrate having the integrated circuit mounted thereon and the flexible substrate having the integrated circuit mounted thereon or may be formed of only the flexible substrate having the integrated circuit mounted thereon.

Figure 3:
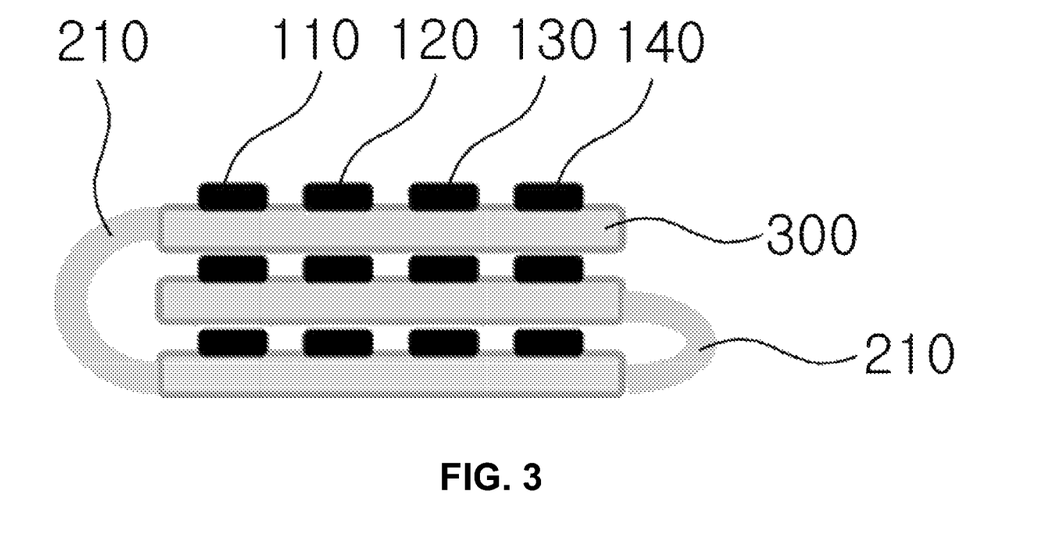
FIGS. 3 and 4 are views showing a structure of a system package using bending properties of a flexible substrate according to one embodiment of the present invention.
Figure 4:
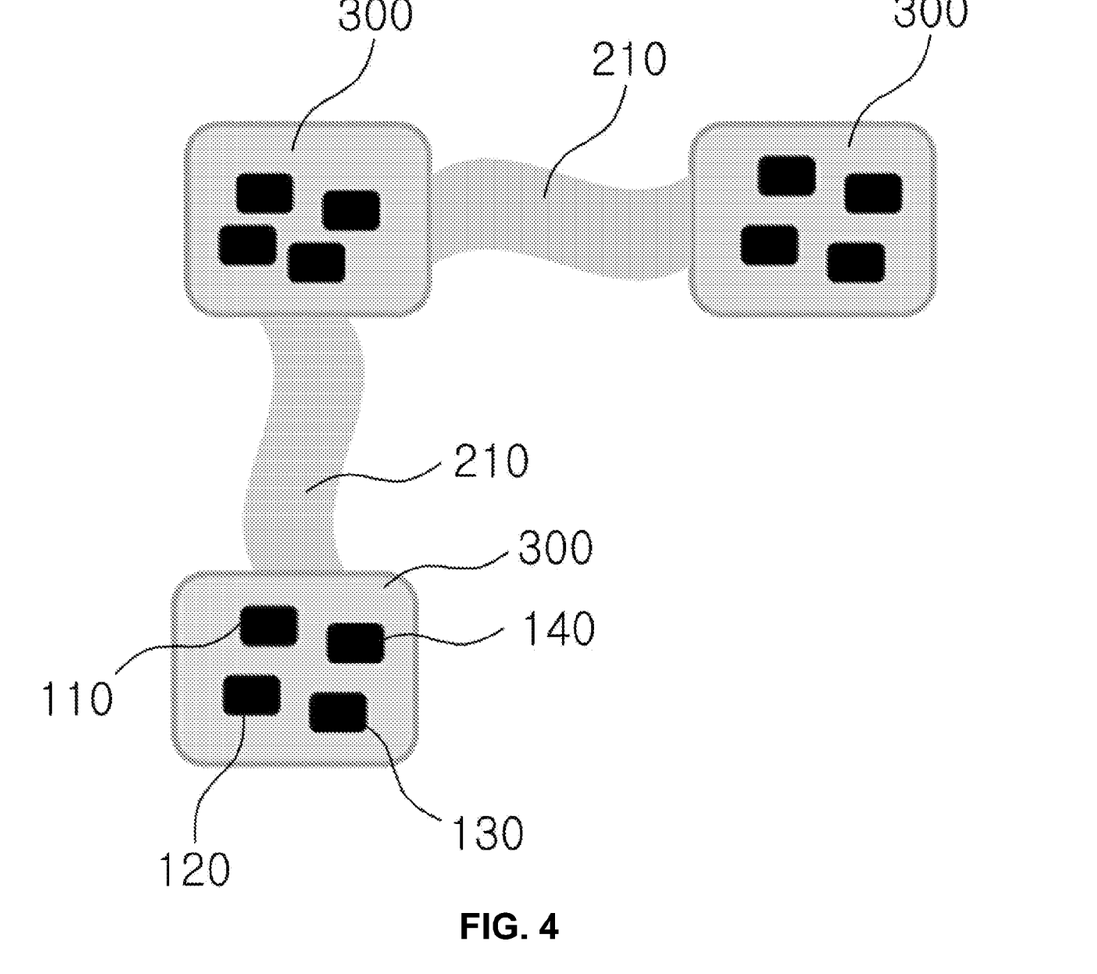

FIGS. 3 and 4 are a view showing the structure of the system package using the bending properties of the flexible substrate according to one embodiment of the present invention. FIG. 3 shows a vertically stacked system package, and FIG. 4 shows plane type of system package (i.e., formed on a plane).

Figure 5:
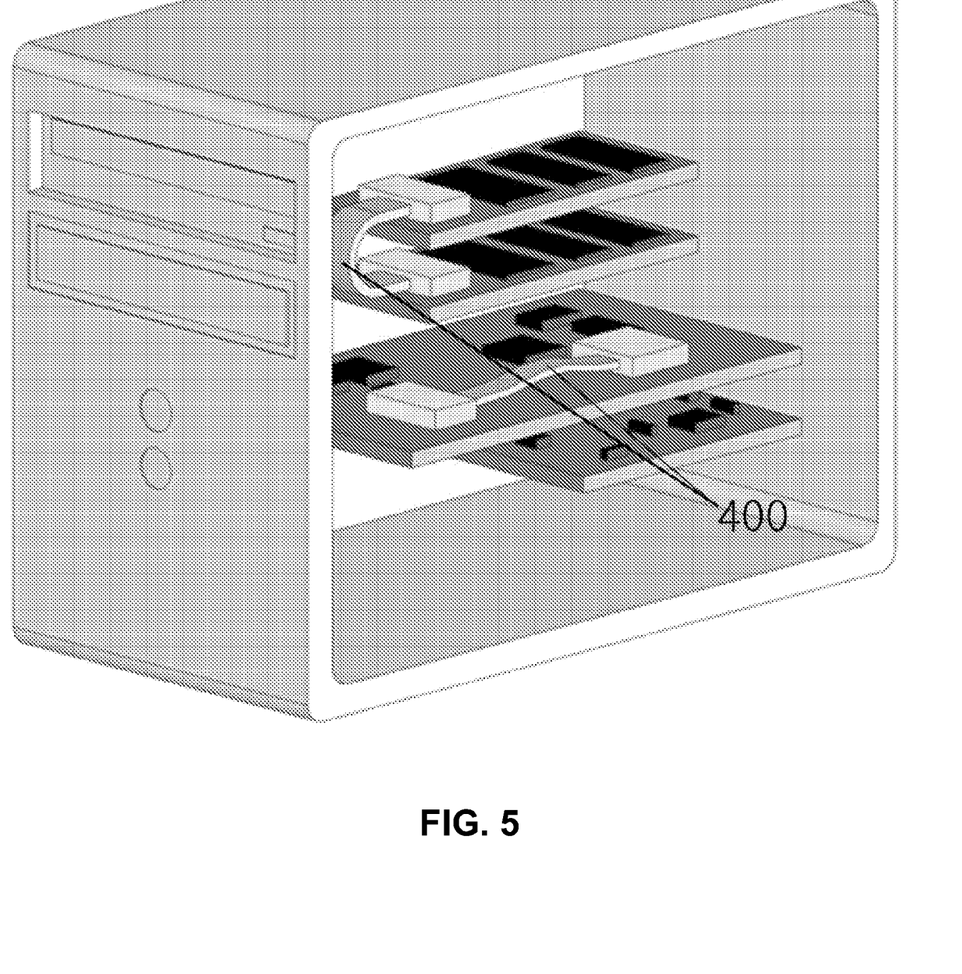
FIG. 5 is a view showing a computer having a system package mounted therein according to one embodiment of the present invention.

FIG. 5 is a view showing a computer having a system package mounted therein according to one embodiment of the present invention. A system package 400 can be effectively installed in a small space by using the flexible opto-electric wiring.

The flexible opto-electric wiring comprises the optical waveguides and the electrical wires that are formed on the inside and outside of the flexible substrate that can be easily bent.

Figure 6:
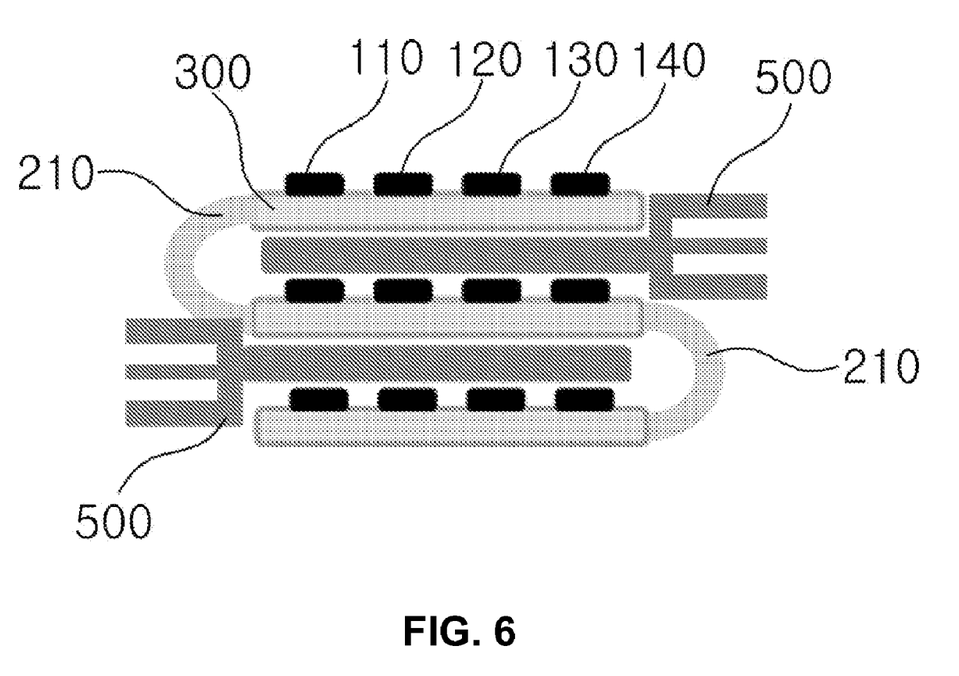
FIG. 6 is a view showing a system package using flexible opto-electric wiring including an auxiliary device according to another embodiment of the present invention.

FIG. 6 is a view showing a system package using flexible opto-electric wiring including an auxiliary device according to another embodiment of the present invention. The system package may comprise at least one auxiliary device 500 formed between the vertically stacked rigid substrates 300 as shown in FIG. 3 or FIG. 5.

The auxiliary device 500 is not particularly limited, but may comprise a heat dissipation device (heat sink) and an electromagnetic wave shielding device, and the like. According to the installation of the auxiliary device 500, the errors in signals caused by the electromagnetic wave interference due to the heat and signals, which are generated by the integrated circuits 110, 120, 130, and 140 are prevented, making it possible to accurately transmit data.

Figure 7:
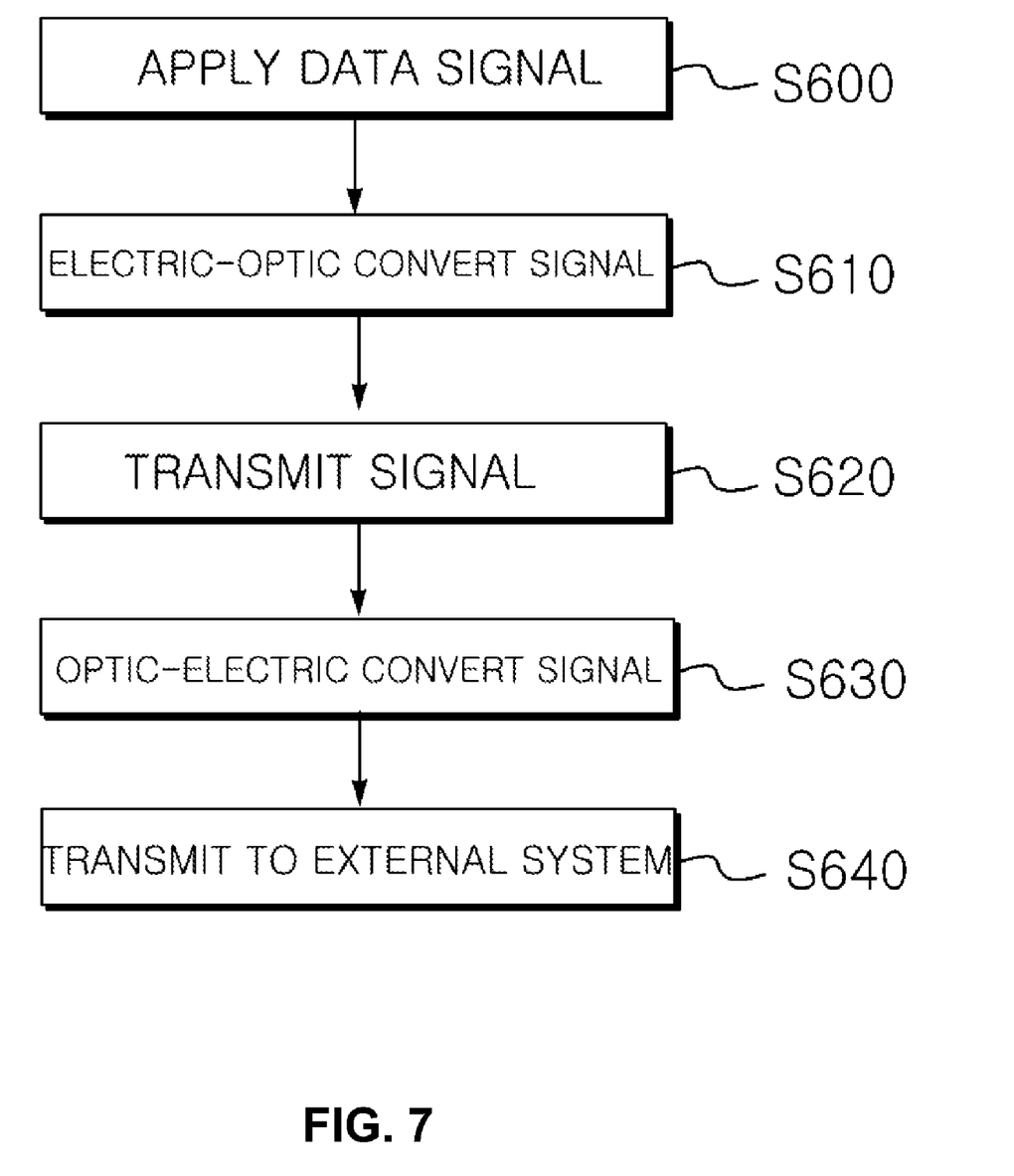
FIG. 7 is a flow chart showing a signal processing method of an integrated circuit system package according to one embodiment of the present invention.

FIG. 7 is a flow chart showing the signal processing method of the integrated circuit system package according to another embodiment of the present invention.

Referring to FIG. 7, at step S600, the high-speed data signals are applied from an external system board having the integrated circuit system package mounted thereon to the inside of the first rigid substrate via an electrical socket.

At step S610, which includes electrical to optical conversion, the data signals applied to the inside of the first rigid substrate are processed through the first integrated circuit mounted on the rigid substrate via the wiring substrate and the processed electrical signals are converted into the optical signals.

At step S620, which includes transmitting the signals, the converted optical signals are transmitted through the optical waveguides of the flexible substrate via the light source and transmitted to the photodetector of the second rigid substrate connected to the flexible substrate. At this time, the interference between the signals is minimized at the time of transmitting the data at high speed through the transmission of the optical signals, such that the data transmission length is not limited and the data can be transmitted up to a long distance.

At step S630, the optical signals received from the first rigid substrate are converted into the electrical signals in the second integrated circuit, processed through the processor of the second integrated circuit, and transmitted to the external system (S640).

In other words, the signals processed through the processor of the second integrated circuit can be transmitted to a third rigid substrate through the second flexible substrate or transmitted to the external system board having the second rigid substrate mounted thereon through the electrical socket.

Further, the electrical signals processed in the second rigid substrate are reversely subjected to the above processes and transmitted to the first rigid substrate, making it possible to process them in parallel with each other by using all the processors of the first integrated circuit and the second integrated circuit.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention.

What is claimed is:

1. A system package using flexible optical and electrical connections comprising:
    at least three rigid substrates having integrated circuit elements mounted thereon, wherein the rigid substrates are arranged substantially parallel and on top of each other;
    a plurality of flexible substrates connected to the rigid substrates, wherein the flexible substrates are arranged on alternate sides of the rigid substrates; and
    optical and electrical connections that connect the rigid substrates and the flexible substrates to the each other, wherein the optical connections include mirrors mounted on the corresponding rigid substrates and oriented at approximately 45 degrees to reflect light from light emitting elements into the flexible substrates.

2. The system package according to claim 1, wherein the rigid substrates are vertically stacked.

3. The system package according to claim 1, wherein the integrated circuit elements comprises an optical integrated circuit having a light source and a photo detector, a digital integrated circuit, an analog integrated circuit, and a high frequency integrated circuit.

4. The system package according to claim 1, further comprising a heat dissipation device between the rigid substrates.

5. The system package according to claim 4, wherein the heat dissipation device has a planar portion arranged between the rigid substrates and heat dissipation portion offset from the rigid substrates.

6. The system package according to claim 4, wherein the heat dissipation device has a plurality of heat sinks having planar portions arranged between the rigid substrates and having heat dissipating portions offset from the rigid substrates.

7. The system package according to claim 1, further comprising an electromagnetic wave shielding device between the rigid substrates.

* * * * *